(12) United States Patent
Martens et al.

(10) Patent No.: US 6,928,373 B2
(45) Date of Patent: Aug. 9, 2005

(54) FLEXIBLE VECTOR NETWORK ANALYZER MEASUREMENTS AND CALIBRATIONS

(75) Inventors: Jon S. Martens, San Jose, CA (US); Rena Ho, San Jose, CA (US); Jamie Tu, San Jose, CA (US)

(73) Assignee: Anritsu Company, Morgan Hill, CA (US)

(*) Notice: Subject to any disclaimer, the term of this patent is extended or adjusted under 35 U.S.C. 154(b) by 98 days.

(21) Appl. No.: 10/641,700

(22) Filed: Aug. 15, 2003

(65) Prior Publication Data

US 2004/0153265 A1 Aug. 5, 2004

Related U.S. Application Data

(60) Provisional application No. 60/444,360, filed on Jan. 30, 2003.

(51) Int. Cl.[7] ............................ G06F 19/00; G01R 35/00
(52) U.S. Cl. ....................... 702/65; 324/601; 455/67.15; 702/85
(58) Field of Search ............................... 702/65, 66, 85, 702/104, 107, 117, 118; 324/74, 601, 638, 76.22; 455/67.15

(56) References Cited

U.S. PATENT DOCUMENTS

| | | | | |
|---|---|---|---|---|
| 5,524,281 A | * | 6/1996 | Bradley et al. | 455/67.15 |
| 5,578,932 A | | 11/1996 | Adamian | 324/601 |
| 5,748,506 A | | 5/1998 | Bockelman | 702/85 |
| 6,060,888 A | * | 5/2000 | Blackham et al. | 324/601 |
| 6,147,501 A | * | 11/2000 | Chodora | 324/601 |
| 6,188,968 B1 | | 2/2001 | Blackham | 702/85 |
| 6,300,775 B1 | | 10/2001 | Peach et al. | 324/601 |
| 6,643,597 B1 | * | 11/2003 | Dunsmore | 702/104 |
| 6,836,743 B1 | * | 12/2004 | Blackham et al. | 702/107 |

OTHER PUBLICATIONS

Anritsu Model 360B Vector Network Analyzer, Operation Manual, Revision F, Chapters 3, 4, 5, 6, 7, 8 and 9, pp. 3–4 to 9–46, Oct. 1997.

Anritsu Application Note, Reflectometer Measurements—Revisited, Rev. C, 12 pages, Apr. 2000.

Bauer, R.F. et al., "De–Embedding and Unterminating," IEEE Transactions of Microwave Theory and Technique, vol. MTT–22, No. 3, pp. 282–288, Mar. 1974.

Daywitt, W.C., "Determining Adapter Efficiency by Envelope Averaging Swept Frequency Reflection Data," IEEE Transactions on Microwave Theory and Techniques, vol. 38, No. 11, pp. 1748–1752, Nov. 1990.

Edwards, M.L., "Calibration and Measurements of S–Parameters," *Microwave & RF Circuits: Analysis, Design, Fabrication & Measurement*, Chapter 7, 23 pages, Sep. 2001.

Fay, P. "Error Correction For Network Analysis—Lab #5," Microwave Circuit Design and Measurements Lab, EE 458/558, 3 pages, Revised Sep. 2001.

(Continued)

*Primary Examiner*—Michael Nghiem
*Assistant Examiner*—John H. Le
(74) *Attorney, Agent, or Firm*—Fliesler Meyer LLP

(57) ABSTRACT

Methods, systems and computer program products for efficiently characterizing devices under test (DUTs) using a vector network analyzer (VNA) are provided. A N-port DUT can be divided as appropriate into multiple sub-devices, or multiple separate devices can be present. A parent calibration is performed. The VNA is then used to determine the S-parameters of interest for each sub-device or separate device, preferably without measuring S-parameters that are not of interest. This can include measuring S-parameters and removing corresponding error coefficients determined during the parent calibration.

20 Claims, 7 Drawing Sheets

OTHER PUBLICATIONS

Glasser, L.A., "An Analysis of Microwave De-embedding Errors," IEEE Transactions on Microwave Theory and Techniques, vol. MTT-26, No. 5, pp. 379-380, May 1978.

Gonzalez, G., *Microwave Transistor Amplifiers, Analysis and Design*, Prentice-Hall, Inc., New Jersey, Chapters 1 and 2, pp. 1-90, Aug. 1996.

King, J.D. et al., "Direct Characterization of Non-Insertable Microwave Test Fixtures For Packaged MMICs," in 57th ARFTG Conf. Digest, pp. 19-27, May 2001.

Matthew, P.J. et al., "RF Impedance Measurement Calibration," http://www.aps.anl.gov/techpub/lsnotes/ls223/ls223.html, 16 pages, Feb. 12, 1993.

Nelson, R., "What are S-parameters, anyway?," Test & Measurement World, http://www.tmworld.com/articles/2001/02_sparameters.htm, 9 pages, Feb. 2001.

"Network Analyser Calibration," http://www.morph.demon.co.uk/Electronics/new.htm, 12 pages, visited Nov. 13, 2001.

Pollard, R.D. et al., "The Calibration Of A Universal Test Fixture,", 1983 MIT-S Digest, pp. 498-500 (year of publication is sufficiently earlier than the effective U.S. filing date and any foreign priority date so that the particular month of publication is not at issue, in accordance with MPEP §609.III.A.).

Product Note, Aglient 8510-13, "Measuring Noninsertable Devices," Agilent Technologies, 15 pages, Aug. 1988.

Randa, J. et al., "Comparison of Adapter Characterization Methods," IEEE Transactions on Microwave Theory and Techniques, vol. 47, pp. 2613-2620, Dec. 1999.

Silvonen, K., Calibration and De-Embedding of Microwave Measurements Using Any Combination of One-or Two-Port Standards, Circuit Theory Laboratory CT-4, Helsinki University of Technology, 28 pages, Dec. 1987.

Tippet, J.C. et al., "A Rigorous Technique for Measuring the Scattering Matrix of a Multiport Device with a 2-Port Network Analyzer," IEEE Transactions on Microwave Theory and Techniques, vol. MTT-30, No. 5, pp. 661-666, May 1992.

Vaitkus, R. et al., "A Two-Tier Deembedding Technique For Packaged Transistors," 1982 IEEE MTT-S Digest, pp. 328-330 (year of publication is sufficiently earlier than the effective U.S. filing date and any foreign priority date so that the particular month of publication is not at issue, in accordance with MPEP §609.III.A.).

Wiatr, W., "A Method for Embedding Network Characterization with Application to Low-Loss Measurements," IEEE Transactions on Instruments and Measurements, vol. IM-36, No. 2, pp. 487-490, Jun. 1987.

Williams, D.F. et al., "In-Line Multiport Calibration Algorithm," in 51st ARFTG Conf. Digest, pp. 88-90, Jun. 12, 1998.

Ferrero, A. "A Simplified Algorithm for Leakey Network Analyzer Calibration," IEEE Microwaye and Guided Wave Letters, vol. 5, No. 4, pp. 119-121, Apr. 1995.

Speciale, Ross A., "A Generalization of TSD Network-Analyzer Calibration Procedure, Covering n-Port Scattering-Parameter Measurements, Affected by Leakage Error," IEEE Transactions on Microwave and Techniques, vol. MIT-25, No. 12, pp. 1100-1115, Dec. 1977.

Eberly, Mike et al., "Intro to the Agilent 8714—RF Network Analyzer," Agilent Technologies, EducatorsCorner.com, Experiments, 7 pages (Apr. 9, 2003).

Wiltron/Anritsu Company, Documentation for the 360B and 37xxx Network Analyzers, pp. 8-34 to 8-38 (at least as early as Jul., 2003).

* cited by examiner

```
          FLEXIBLE CAL
SELECT INPUT METHOD
   (BY PORT)
      FULL TERM CALS

REFLECTION ONLY
   (BY S-PARAM)
   ▶ CUSTOMIZE CAL

FLEXIBLE CAL MODE

APPLY

DEFINE

HELP                    OFF

RETURN
```

FIG. 4

```
  FULL TERM CAL                    REFLECTION ONLY
(FULL 4 PORT CAL)                (FULL 4 PORT CAL)

► PORT1        ON                ► PORT1        ON

PORT2        ON                  PORT2        ON

PORT3        ON                  PORT3        ON

PORT4        ON                  PORT4        ON

RETURN                           RETURN
```

FIG. 5A                          FIG. 5B

```
        CUSTOMIZE CAL
    <FULL 4 PORT CAL>

SET ALL ON

SET ALL OFF

S11, REFL           ON

S12, TRANS          ON

S21, TRANS          ON

S22, REFL           ON

► MORE

RETURN
```

FIG. 5C

FLEXIBLE VECTOR NETWORK ANALYZER MEASUREMENTS AND CALIBRATIONS

PRIORITY CLAIM

This application claims priority to U.S. Provisional Application No. 60/444,360, entitled "Flexible Method for Applying Vector Network Analyzer Calibrations," filed Jan. 30, 2003.

FIELD OF THE INVENTION

The present invention relates to the field of scattering (or "S") parameter measurement instruments, such as a vector network analyzer (VNA).

BACKGROUND OF THE INVENTION

Multi-port devices are characterized by their number of ports, typically referred to throughout this application as N, where N is 2 or greater. S-parameter measurement instruments, such as a vector network analyzer (VNA), are used to characterize such a multi-port (i.e., N-port) device under test (DUT, often simply referred to as a "device") by measuring complex transmission and reflection characteristics of the DUT.

In the RF and microwave regions virtually all devices are characterized by their S (or scattering) matrices. The S matrix is composed of S-parameters. S-parameter measurement is the standard method for device characterization over a very wide range of frequencies, from less than 1 MHz to above 40 GHz. These parameters are used because they are easily determined, they provide directly relevant measures of device performance, and they are well defined for various types of devices. If other device representations are required, such as impedance or admittance parameters, then these can be readily deduced from the measured S-parameters.

More specifically, S-parameters of a multi-port device characterize how the device interacts with signals presented to the various ports of the device. An exemplary S-parameter is "$S_{12}$." The first subscript number is the port that the signal is leaving, while the second is the port that the signal is being injected into. $S_{12}$, therefore, is the signal leaving port 1 relative to the signal being injected into port 2. The four S-parameters associated with an exemplary two-port device are:

$S_{11}$ is referred to as the "forward reflection" coefficient, which is the signal leaving port 1 relative to the signal being injected into port 1;

$S_{21}$ is referred to as the "forward transmission" coefficient, which is the signal leaving port 2 relative to the signal being injected into port 1;

$S_{22}$ is referred to as the "reverse reflection" coefficient, which is the signal leaving port 2 relative to the signal being injected into port 2; and $S_{12}$ is referred to as the "reverse transmission" coefficient, which is the signal leaving port 1 relative to the signal being injected into port 2.

A large number of commercial test systems are available for S-parameter measurement. Such systems are generally referred to as network analyzers. These instruments typically fall into two classes: scalar and vector. Scalar analyzers determine the amplitudes of the S-parameters only, whereas vector analyzers (VNAs) determine both the amplitudes and the phases. Scalar analyzers are far less flexible and far less accurate than vector analyzers, and are typically only employed in low-grade applications where equipment cost is a driving factor. Although embodiments of the present invention are generally applicable to VNA test instruments, the embodiments may also apply to other types of instruments that characterize S-parameters (or other equivalent measurements) for a multi-port DUT.

Commercial VNA systems typically include a signal generator and a combination of splitters and directional couplers that connect the measurement ports of the VNA to its amplitude and phase detection circuitry (samplers). A typical DUT to be characterized by such a VNA has one, two or more ports, typically with coaxial or waveguide interfaces. For an N-port DUT, the S matrix (N×N) can be defined by: b=Sa, where a is an N-component vector containing the amplitudes of the waves incident on the device ports, and b is a vector containing the amplitudes of the outgoing waves. More formally, the wave amplitudes are defined by: $a_i=(V_i+Z_iI_i)$, 2; and $b_i=(V_i-Z_iI_i)/2$, where $a_i$ is the incident voltage wave amplitude, $b_i$ is the outgoing voltage wave amplitude, $V_i$ is the voltage, $I_i$ is the input current, and $Z_i$ is the normalizing impedance, all for the $i^{th}$ port under test.

The port-normalizing impedances ($Z_i$) are typically chosen to be equal to the characteristic impedances of the coaxial cables in the test system, which are 50Ω in most cases. If a given port is terminated with its normalizing impedance (a matched load) then the incident wave amplitude at that port is identically zero (from $a_i=(V_i+Z_iI_i)/2$).

When a DUT is connected to the test ports of a network analyzer, a signal is applied to each device port in succession, and the reflected and transmitted waves are detected with the aid of the directional couplers. The S-parameters for the DUT are then deduced by measuring the amplitude and phase of each of these waves relative to those of the input signal.

In practice, there are inevitable hardware imperfections or errors in any VNA test system, which are principally related to port mismatch, coupler directivity, and instrument frequency response. Without correction, these imperfections can produce significant measurement errors. Such imperfections are typically compensated for though appropriate VNA calibrations. VNA calibrations are typically performed by connecting physical standards (also known as mechanical primary standards) to each of the ports of the VNA for the purpose of calibration. Electrical characteristics of the standards are derived from known physical properties of the standards, such as physical dimension, conductor material, and the like. The errors of the VNA are typically determined by computing the difference between the VNA measured response of the standards and known electrical characteristics of the standards. After the VNA is calibrated, an uncharacterized DUT can be connected to the VNA for measurement, and the errors associated with the VNA (determined during calibration) can then be mathematically removed from the measurement of the DUT. Many modern VNAs include internal automatic calibrators that perform the calibration.

Calibrations (typically multi-port calibrations) are normally performed and then applied as a whole. For example, a 4-port calibration is performed and then applied by making 16 S-parameter measurements and using the error coefficients (arrived at during the performance of the calibration) to correct the data. If multiple M-port sub-devices are being tested at once, or a given N-port device is essentially composed of two or more M-port sub-devices (M<N), then either: a) a series of M-port calibrations are performed and recalled sequentially; orb) a full N-port calibration is always used although it may not always be needed. Both of these require more time than a calibration application appropriately scaled to the problem at hand.

The following references, which are incorporated herein by reference, describe exemplary N-port calibrations: R. A. Speciale, "A Generalization of the TSD Network-Analyzer Calibration Procedure, Covering n-Port Scattering-Parameter Measurements, Affected by Leakage Errors,"

IEEE Trans. On MTT, vol. 25, December 1977, pp. 1100–1115; and A. Ferrero and F. Sanpietro, "A Simplified Algorithm for Leaky Network Analyzer Calibration," IEEE. Micr. And Guided Wave Lett.," vol. 5, April 1995, pp. 119–121.

When VNA measurements were limited to straightforward 1-, 2- and 3-port devices, the application of a calibration was fairly simple, e.g., perform a 1-, 2- or 3-port calibration as appropriate and measure the S-parameters. In the interests of efficiency, some test methods have become compound, e.g., measure two 2-port devices in parallel or measure one while a handler is positioning another. Also, more DUTs have become compound, e.g., two 2-port devices in a single package, or a 1-port and a 3-port device in a single package, etc. Applying the calibrations can be inconvenient in some of these scenarios. Often, more S-parameter measurements are made than required to produce the needed parameters and/or multiple calibration files are sequentially recalled as needed. Both of these arrangements consume excess time and reduce test throughput.

There is a need for more efficient techniques for producing S-parameter measurements and applying VNA calibrations. Preferably, such techniques should increase measurement throughput, particularly for multi-port devices.

SUMMARY OF PRESENT INVENTION

Embodiments of the present invention provide efficient techniques for applying VNA calibrations and increasing measurement throughput, particularly for multi-port devices. This is accomplished, in accordance with specific embodiments of the present invention, by making only using those measurements needed and using only the appropriate sub-set of error coefficients when applying VNA calibrations. Embodiments of the present invention can be implemented, for example, as methods, systems and/or computer program products.

In accordance with embodiments of the present invention, a N-port device under test (DUT), where appropriate, is divided (not physically) into multiple sub-devices that each include less than N ports. This dividing can be based on transmission path levels between the N-ports. More specifically, a transmission path level between each pair of the N ports can be determined, and the ports can be grouped together as being part of a same sub-device or a different sub-device based on relative transmission levels between the pairs of ports. Embodiments of the present invention can also be used with multiple physically separate devices.

Next, a parent calibration is performed. The VNA is then used to determine the S-parameters for each sub-device, or separate device. This can include measuring S-parameters and removing corresponding error coefficients determined during the parent calibration. In accordance with embodiments of the present invention, the parent calibration results in a set of error coefficients representative of calibration errors. Then, when the calibration is applied to correct measured S-parameters, preferably only the sub-set of error coefficients corresponding to the S-parameters of interest are used to correct the S-parameters.

In accordance with embodiments of the present invention, at least one menu is presented (e.g., on a display of a VNA) that allows selection of which S-parameters are of interest for each sub-device or separate device. To increase efficiency, in accordance with embodiments of the present invention, only the S-parameters of interest for each sub-device or separate device are determined, without determining the S-parameters that are not of interest.

In accordance with embodiments of the present invention, the error coefficients determined during the parent calibration are stored in quickly accessible (e.g., volatile) working memory so that there is no need to recall calibration data from slower (e.g., non-volatile) storage memory each time a different sub-device or separate device is to be measured.

Further embodiments, and the features, aspects, and advantages of the present invention will become more apparent from the disclosure set forth below.

BRIEF DESCRIPTION OF THE FIGURES

FIG. 4 illustrates an exemplary main flexible calibration menu that can be displayed on a VNA, in accordance with embodiments of the present invention.

FIGS. 5A and 5B illustrate, respectively, an exemplary full term calibration sub-menu and an exemplary reflection only sub-menu, each of which can be displayed on a VNA, in accordance with embodiments of the present invention.

FIG. 5C show an exemplary flexible calibration sub-menu that can be displayed on a VNA, in accordance with embodiments of the present invention.

DETAILED DESCRIPTION

Figure 1:
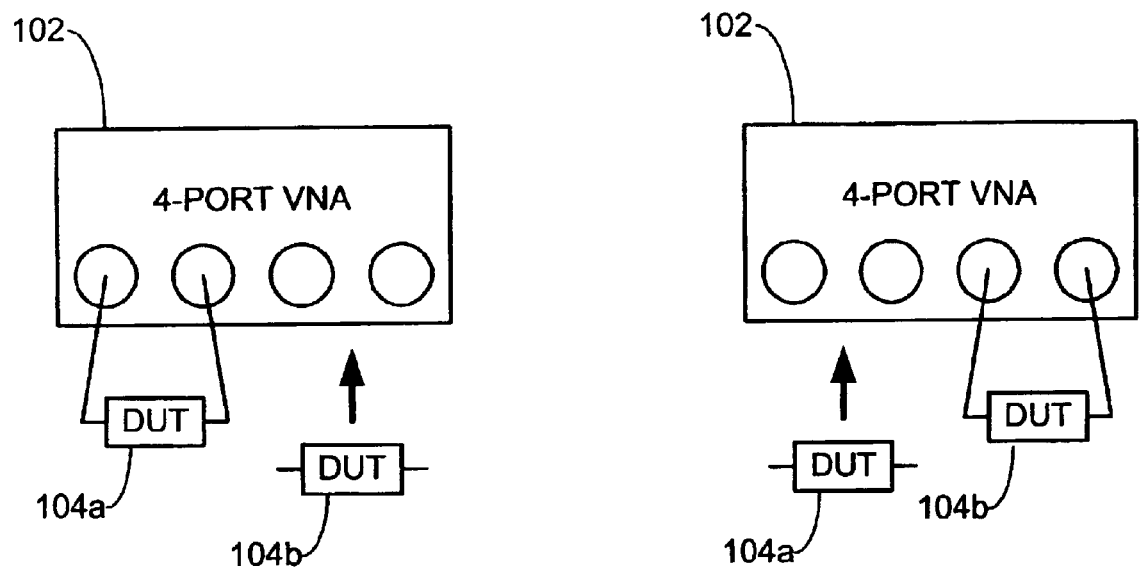
FIG. 1 is used to show an exemplary measurement where a 4-port VNA is used to measure two 2-port DUTs.

In accordance with embodiments of the present invention, calibrations are subdivided so that only required portions (and hence only required measurements) are used at any given time. Such calibrations of the present invention shall be referred to herein as "flexible calibrations" or simply "flexible cals." Features of the present invention can be implemented in a VNA, in which a flexible calibration mode (or simply "flexible cal mode") according to embodiments of the present invention, is included. The flexible cal mode, in accordance with embodiments of the present invention, allows an existing 2-, 3- or 4-port S-parameter measurement and calibration to be quickly subdivided so that only the required measurements are taken and only appropriate error coefficients are applied. This configuration can be changed, for example, by a simple command string (a VNA front panel command or a commend from an external controller, e.g., a PC) so that no setups need to be recalled from memory or disk, thus allowing faster changeover between measurements. The following description explains how flexible cal might be used and how it can improve measurement throughput in some situations.

An important principle behind flexible cal is based on the realization that the saving and recalling of VNA setups can be more time consuming than the measurements themselves. This is even true for recalls from memory, but becomes even more obvious when recalling from disk. If multiple setups can be enabled without a recall (such that error coefficients need not be reloaded), overall throughput can be improved. In accordance with embodiments of the present invention, this can be accomplished by having all error coefficients (relevant to S-parameters of interest) available in working memory (which is likely volatile memory), but just enabling those that are needed. This is important because often many different calibrations are performed before the S-parameter measurements are performed for different types of DUTs.

Calibration data (i.e., error coefficient data) and setups are generally large in terms of consuming memory, and thus, data associated with the various calibrations and setups are often stored in relatively slow and inexpensive storage memory (which is likely non-volatile memory), such as on a disk (e.g., a hard disk or a floppy disk) or in registers. Such storage memory is typically static (i.e., retains contents on removal of power) and much larger than working memory, causing access speeds to be much slower as compared to access to working memory. In contrast, data that is presently being used to perform calculations, and the like, are often resident in faster more expensive working memory, such as dynamic random access memory (DRAM). Due to its cost, the faster working memory typically has much less capacity than the slower storage memory. Accordingly, the appropriate calibration data is generally recalled from the slower storage memory and copied into the faster working memory when a calibration needs to be applied, e.g., when S-parameter measurements for a specific device are being made. This recalling is time consuming, and thus, slows down the measurement throughput. To increase measurement throughput, in accordance with embodiments of the present invention, all of the error coefficients that are deemed to be relevant to the S-parameters of interest are recalled at once from slower storage memory and moved into faster working memory, or maintained in the faster working memory following the parent calibration (without ever being stored in slower storage memory).

Another important concept behind flexible cal is that there are a number of test scenarios when a full 3- or 4-port calibration is not needed for every measurement, but, overall all ports are needed at some point. This occurs with DUTs that are only partially connected, meaning all ports are not linked by low insertion loss paths so that every port does not affect every measurement (a counterexample would be a power divider, this type of DUT does not benefit from flexible cal). The result is that unnecessary measurements are performed a good portion of the time. To see this, consider the examples discussed below.

There is a trend in consumer electronics to include multiple functional blocks in a single chip package, to thereby reduce production costs. As will be appreciated from the following discussion, embodiments of the present invention are very useful for measuring the characteristics associated with such packages.

EXAMPLE #1

In a first example, a 4-port VNA is used to measure a pair of 2-port DUTs. While one is being measured, the next is being loaded in the other position and vice-versa. The user has two options:

a) A first option is to use two 2-port calibrations and recall a calibration setup between each measurement subgroup. If the handler is roughly as fast as the measurement, this results in lost time since the second device is ready to be measured except its calibration has yet to be recalled.

b) A second option is to use a 4-port calibration, but now 16 parameters must be measured each time when only 4 are needed. This also results in lost time.

FIG. 1 illustrates the first example measurement using a 4-port VNA 102. A first 2-port DUT 104a is being measured in FIG. 1, while a second DUT 104b is being moved into position (e.g., by a robotic handler). After the S-parameters are measured for DUT 104a and the corresponding calibration is applied, the calibration information corresponding to the two VNA ports to which DUT 104b is about to be connected must be recalled. If the handling time is not large relative to the measurement time, the recalling of the calibration can drastically affect throughput.

EXAMPLE #2

In a second example, a 4-port VNA is used to measure four 1-port DUTs (e.g., antennas or resonators). These may be four separate DUTs tested two at a time (analogous to the above two device problem) or four devices that should be measured together for reasons of comparison. In the first case, the reasoning of Example #1 applies, i.e., time is lost recalling calibrations between swaps or excess measurements are taken. However, this time the penalty is worse since only one parameter is required per 1-port DUT. Even in the second case time is lost since only four 1-port calibrations are needed (four measurements as opposed to sixteen).

Figure 2:
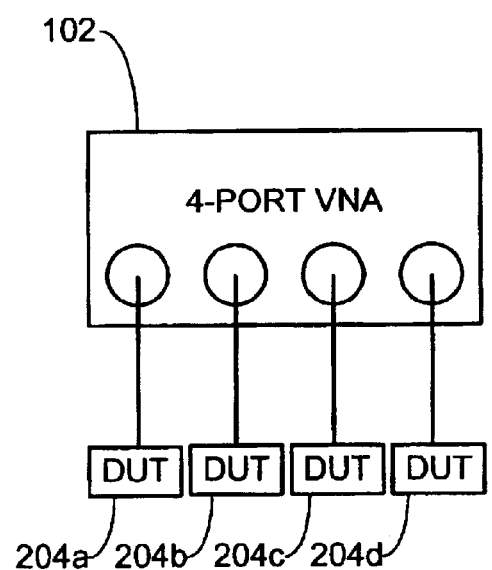
FIG. 2 is used to shown an exemplary measurement where a 4-port VNA is used to measure four 1-port DUTs.

FIG. 2 illustrates the second measurement example. Four 1-port devices 204a, 204b, 204c and 204d are to be tested in FIG. 2 (with each device being, e.g., an antenna or resonator). The devices 204a, 204b, 204c and 204d may either be rapidly moved in and out (four measurement in parallel for speed), in which case the reasoning of Example #1 is just multiplied. Alternatively, this could represent multiple 1-ports that must be tested together for comparison purposes. In either case, significant time savings are possible through careful calibration application.

EXAMPLE #3

In a third example, a 3-port device includes a 1-port resonator/antenna and a 2-port sub-DUT. If leakage is not of interest, then one would really like to measure only five parameters, not nine (as would be the case with a true 3-port DUT). Again, the idea is to avoid measuring more than is needed.

Figure 3:
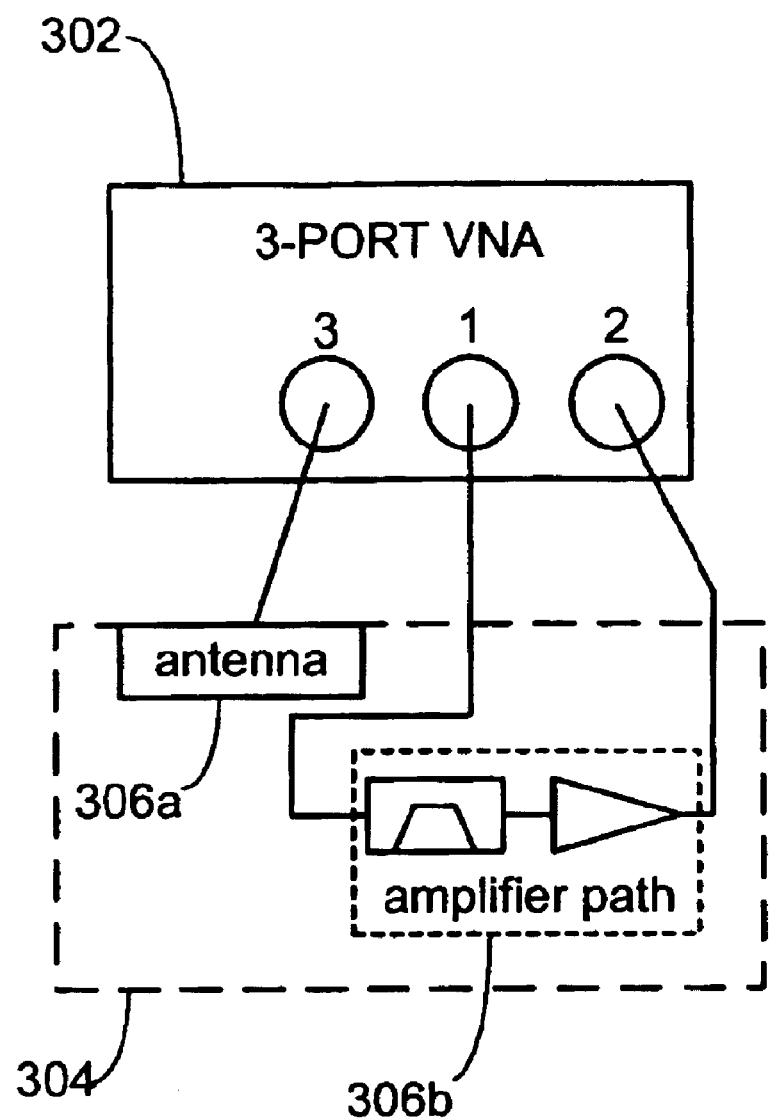
FIG. 3 is used to shown an exemplary measurement where a 3-port VNA is used to measure a 3-port DUT made up of a 1-port sub-device and a 2-port sub-device.

FIG. 3 illustrates the third measurement example using a 3-port VNA 302. The DUT 304, which can be, e.g., a front end module for a cell phone, includes a 1-port sub-device 306a (e.g., an antenna) and a 2-port sub-device 306b (e.g., an amplifier path), where the two sub-devices 306a and 306b are not electrically connected together. The external ports may be available, for example, for connecting an external filter. DUT 304 is an example of a package, which to reduce manufacturing costs, includes multiple function blocks that are not electrically connected to one another within the package. Since 1-port sub device 306a is not electrically connected to 2-port sub-device 306b, there should be zero, or at least very low (e.g., due to leakage), transmission between the one port of DUT 304 corresponding to sub-device 306a and the other ports that correspond to the sub-device 306b. Embodiments of the present invention take advantage of this realization. In other words, since only five of nine S-parameters are needed (and only that many needed for correction) to characterize DUT 304, a careful use of the calibration, in accordance with embodiments of the present invention, can again save time.

The flexible measurements and calibrations of the present invention shall now be discussed. This operation requires that a single multi-port calibration be performed (2-, 3- or 4-port), possibly with an automatic calibrator for additional time savings. Then, when a given measurement is to be performed, the user or the controlling automatic test equipment (ATE) program informs the VNA (e.g., VNA 102) what portion of the calibration is to be used. The simplest case is when a full M-port calibration is enabled. In Example #1 above, one might do a full 4-port calibration to start, and then enable a 2-port calibration for each of the measurement groups (i.e., for each sub-device). In Example #2 above, a full 4-port calibration would probably be done and then a series of 1-port calibration subsets would be used.

An exemplary flexible cal main calibration menu that can be displayed on a VNA is illustrated in FIG. 4. The three types of sub-calibrations that can be accessed are presented, including: full term cals, reflection only and customize cal. Once a selection is made and defined (see later FIGS.), APPLY is used to activate the flexible cal. More specifically, an operator selects one of the flexible cal options (i.e., either full term cals, reflection only or customize cal) and the corresponding sub-menu is displayed on the VNA. The sub-menu for a full-term cal is shown in FIG. 5A, for a reflection only cal is shown in FIG. 5B, and for a customize cal is shown in FIG. 5C, each of which is discussed below. Once in a sub-menu, the user selects which calibrations/measurements are of interest and then returns to the main menu (e.g., by selecting RETURN on the sub-menu). At that point, the user can select APPLY on the main menu, which causes the VNA to perform the selected S-parameter measurements, and to apply the calibrations by removing appropriate errors from the measured S-parameters.

Once a parent calibration has been performed, this menu can be used to select the appropriate subset (remote commands can of course be sent, e.g., via GPIB or Ethernet). Exemplary uses of the three choices are discussed in more detail below.

1) full term cals—if the parent calibration is a 4-port calibration, one would use this to select a full 2- or 3-port calibration or to re-enable the full 4-port calibration; if the parent calibration is a 3-port calibration, one would use this to select any 2-port calibration or reselect the 3-port calibration.

2) reflection only—one would use this select one or up to 4 reflection-only 1-port calibrations.

3) customize cal—used to select different combinations than full term or 1-port calibrations.

FIGS. 5A and 5B, respectively, show exemplary sub-menus for selecting full term calibrations and reflection-only (1-port) calibrations using flexible cal of the present invention. Although the menus look the same (except for the headings), their functionality is quite different. For example, when multiple ports are selected on the reflection-only submenu in FIG. 5B, a 1-port S-parameter measurement at each of the ports is activated. In contrast, when multiple ports are selected on the full term calibrations submenu in FIG. 5A, a full term S-parameter measurement encompassing all selected ports is activated. In a more specific example, suppose the parent calibration is a 4-port calibration, and ports 1, 2 and 4 are selected on the sub-menus of FIGS. 5A and 5B. Using the "reflection only" submenu in FIG. 5B, 1-port S-parameter measurements at ports 1, 2 and 4 are performed, i.e., the VNA will measure $S_{11}$, $S_{22}$ and $S_{44}$ and correct them. Using the "full term cal" submenu of FIG. 5A, a 3-port S-parameter measurement using ports 1, 2 and 4 is performed, i.e., VNA will measure $S_{11}$, $S_{12}$, $S_{14}$, $S_{21}$, $S_{22}$, $S_{24}$, $S_{41}$, $S_{42}$, and $S_{44}$ and correct them.

FIG. 5C is an exemplary submenu for "customized calibration," which allows S-parameters that are of interest to be specified. Any (or all) of the $N^2$ S-parameters covered by the parent calibration can be selected on the screen shown in FIG. 5C, or the remaining similar ones connected by the 'MORE' softkey. In the case of the third example discussed above, one might perform a 3-port parent cal and then select parameters $S_{11}$, $S_{12}$, $S_{21}$, $S_{22}$ and $S_{33}$ only (note the port numbering in FIG. 3).

In accordance with embodiments of the present invention, the sub-set of error coefficients to be included in S-parameter correction is automatically determined as best as possible within the constraints supplied. In accordance with specific embodiments of the present invention, the rules for the selecting the appropriate error coefficients are as follows:

a. If a reflection parameter is selected ($S_{ii}$), then include all reflectometer error coefficients (e.g., directivity, source match and tracking error coefficients) for that port. If isolated, this works like a one-port reflection-only calibration.

b. If a transmission parameter is selected, select its tracking error coefficient. If done alone, this works like a normalization calibration.

c. If a transmission parameter is selected along with its matching reflection parameter (e.g., $S_{12}$, $S_{11}$ and $S_{22}$), include load match error coefficients.

The net effect is if the user specifies all 4 parameters associated with a 2-port, then a full 2-port correction will be enabled. If only $S_{ii}$ and $S_{ji}$ are activated, then a 1 path-2 port calibration will effectively be enabled. Note that although the system can be fairly intelligent in which terms it uses, it knows little about the DUT. The user can help by specifying not only the measurements needed but also ones that are critical. The term 'critical' refers to those paths tightly connected to the desired measurements but not on the measurements list. Consider if Example #3 was actually a 4-port DUT (and a four port VNA was available) and where the 4th port was connected by a low insertion loss path to the amplifier output. It may be necessary to include $S_{44}$, $S_{42}$, and $S_{24}$ in the customization if a high degree of accuracy is needed on $S_{21}$ or $S_{22}$ and it was not possible to separately terminate port 4. Situations like these are rare and usually obvious; the factory that produced the DUT can typically be consulted if there are questions.

To help illustrate the flexible cal process, we will look at Example #3, where a 3-port DUT includes an integrated antenna to be treated as a 1-port sub-device and a amplifier path to be treated as a 2-port sub-device. While the potential time savings are explained below, a discussion of FIG. 6 will illustrate that in partially connected DUTs such as this, there is no accuracy penalty in using flexible cal features of the present invention.

A full three port cal was performed over 700–1000 MHz and measurements performed with both the full three port calibration and with the flexible cal defined as a Custom Cal using $S_{11}$, $S_{12}$, $S_{21}$, $S_{22}$ and $S_{33}$. The results are compared, in an overlay, in FIG. 6. As expected, there is no significant difference when only five parameters were measured per cycle (in accordance with embodiments of the present invention) instead of nine. As stated before, this works for partially connected DUTs such as those discussed previously.

Figure 6:
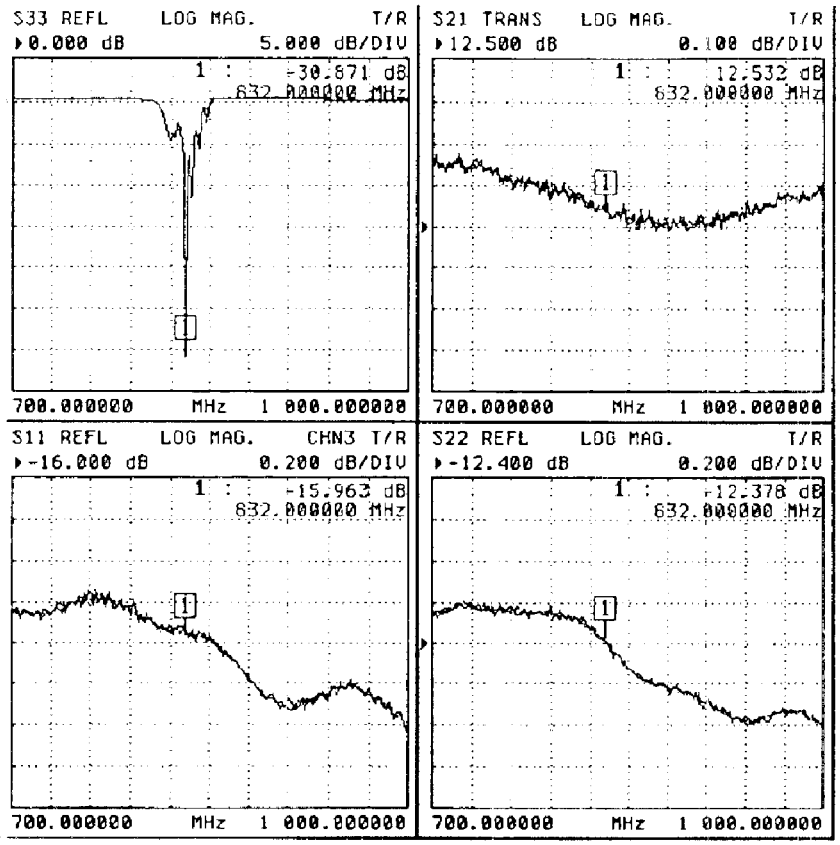
FIG. 6 shows a graph that compares flexible calibrations results, using embodiments of the present invention, with full 3-port calibration results on a DUT.

In FIG. 6, the light trace is the full calibration result, while the dark trace uses flexible cal. Aside from some minor differences due to trace noise (measurement done in a very wide IFBW with no averaging for speed), the traces overlay completely.

The amount of time saved by using flexible cal is largely determined by the number of unnecessary measurements that are avoided. If the IFBW is very high, there is some unavoidable overhead that is neglected in this analysis (i.e., in the realm where measurement time limits throughput). Initially it will be assumed that the old method choice refers to using a full N port calibration.

TIME SAVINGS FOR EXAMPLE #1

Measurements reduced by 50% over a full calibration with no loss in accuracy assuming all four S-parameters are needed per 2-port sub-DUT. If the test device was two DUTs in a package, this would also be the time reduction. If the two DUTs are switches as in FIG. 1, then the time savings is dependent on handler speed. Suppose the measurement time per parameter is 15 ms and the handler time is 60 ms. The flexible cal cycle time is then 15*4*2=120 ms while the old cycle time would be (15*16)+60=300 ms. If the handler time is 120 ms, then the flexible cal cycle time is 60+(120–

60)+60+(120−60)=240 ms while the old cicle time would be (15*16)+120=360 ms (still a 33% savings).

TIME SAVINGS EXAMPLE #2

Measurements reduced by 75% over a full cal with no loss in accuracy. If DUTs are tested four at a time, this would also be the time reduction in a measurement time-limited scenario. If, for example, two DUTs are changed while two are being measured, then the time savings is dependent on handler speed. Suppose the measurement time per parameter is 15 ms and the handler time is 30 ms. Ignoring other overhead, the flexible cal total time would be 30+30=60 ms whereas the old cycle time (not handler limited) was (16*15)+30=270 ms. If the handler time was 100 ms, the flexible cal cycle time (handler limited would be 30+(100−30)+30+(100−30)=200 ms and the old cycle time would be 340 ms (still a 41% savings).

TIME SAVINGS FOR EXAMPLE #3

Measurements reduced by 44% over a full calibration with no loss in accuracy. This would also be the time reduction in a measurement time-limited scenario.

If a recall cycle was used instead of full N-port, the time differential would be tied to the recall time. In many instruments, this time exceeds 200 ms (even more if recalling from disk). To reprocess example 1 with the first handler speed, the flexible cal approach would lead to a cycle time of 120 ms while a recall-approach would take at least 320 ms.

As might be expected, the actual time savings is a strong function of the measurement (number of points, averaging, IFBW, etc.), the recall methods if used (from memory, hard disk or network, how large a setup file, etc.) and any handling variables.

Figure 7:
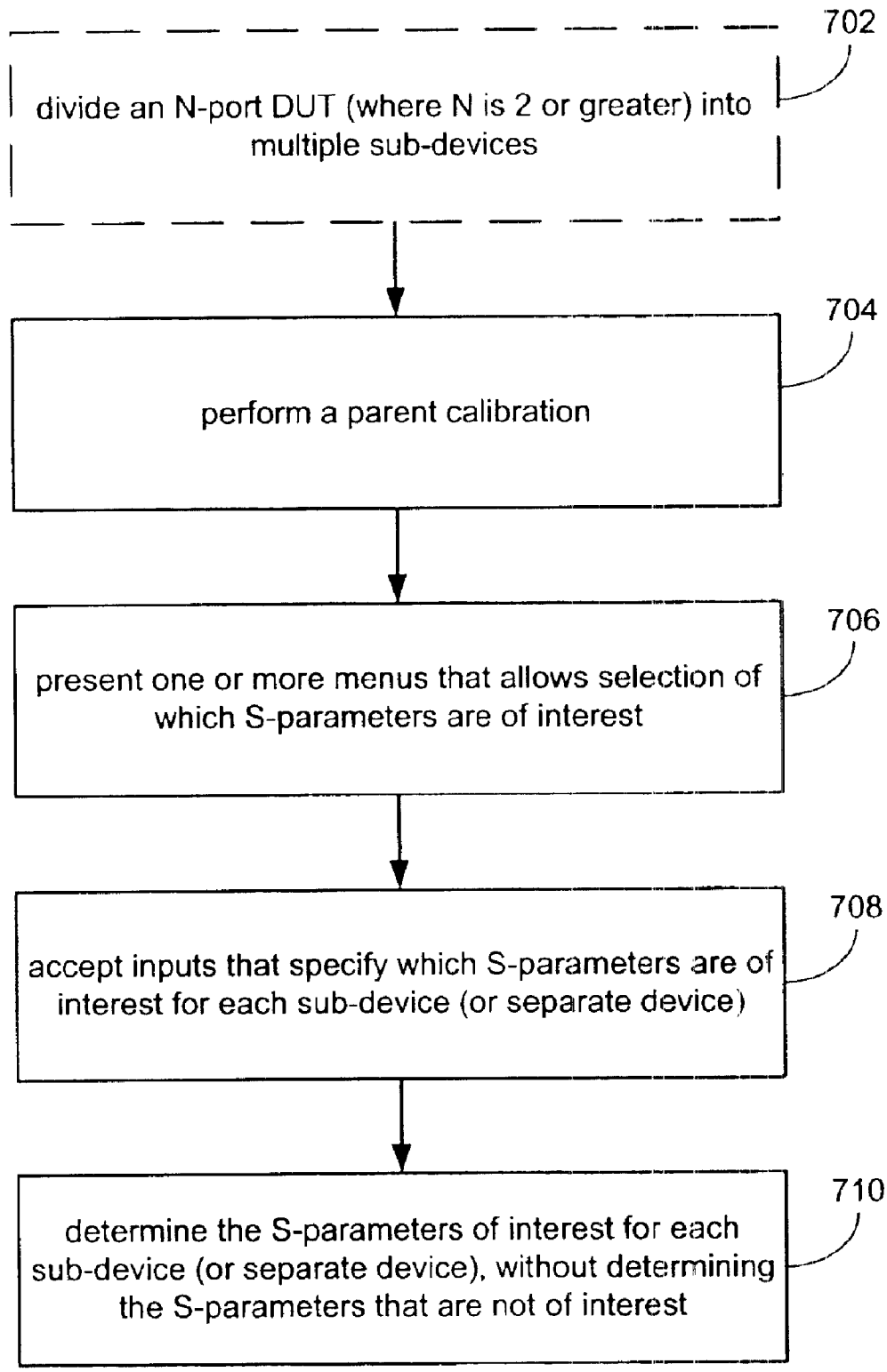
FIG. 7 is a high level flow diagram useful for describing embodiments of the present invention.

FIG. 7 is a high level flow diagram useful for describing embodiments of the present invention that efficiently characterize an N-port device using a VNA, where the N-port device is capable of being treated as multiple sub-devices, such as in FIG. 3.

At a first step 602, the N-port device is divided into multiple sub-devices. The term "divide" in this step is not meant to indicate that the device is actually physically separated. Rather, the term "divide" in this step is meant to indicate that ports of the device are grouped together in such a way that each group of ports can be treated as a separate sub-device of the larger N-port device. This is most likely accomplished based on transmission path levels between the N-ports. Transmission path levels can be measured between each pair of the N-ports. Then, the ports can be grouped together as being part of the same sub-device, or a different sub-device, based on the relative transmission levels between the pairs of ports.

In a specific embodiment, a highest transmission path level associated with a port is compared to other possible transmission path levels associated with that port. Then, those of the other ports that produce a transmission level path within a threshold range (e.g., 60 dB) are grouped as being part of the same sub-device, and those of the other ports corresponding to a transmission level path not within the threshold range are grouped as being part of another sub-device (i.e., as not being part of the same sub-device as the port currently being analyzed). If relatively coarse device measurements are desired, then the threshold can be reduced (e.g., to 40 dB). Conversely, if very accurate device measurements are desired, then the threshold can be increased (e.g., to 90 dB). Additionally, if there is virtually no transmission between a port and other ports (e.g., as compared to a reflection measurement), then that port can be grouped as being part of its own 1-port sub-device, as was the case with the antenna 306a in FIG. 3.

When multiple physically separated devices are being tested, as in FIG. 2 for example, then step 702 may be skipped.

At a next step 704, a parent calibration is performed. The parent calibration is a multi-port calibration used to determine all the error coefficients that will be necessary to correct S-parameter measurements of interest. In other words, the parent calibration is a multi-port calibration encompassing all the potential transmission paths needed to measure the sub-devices (e.g., as in Example #3) or separate devices (e.g., as in Examples #1 and #2) of interest. For example, if all 4 ports of a 4-port VNA are going to be used to measure various sub-devices and/or separate devices, the parent calibration should be a 4-port calibration. However, if for example ports 1, 2 and 4 (but not port 3) of a 4-port VNA are going to be used to measure sub-devices and/or separate devices, the parent calibration can be a 3-port calibration encompassing ports 1, 2 and 4 (i.e., without encompassing port 3).

The parent calibration should be at least as large as the largest calibration necessary based on the number of ports in the largest sub-device to be measured, or based on the largest number of ports of the VNA to be used. For example, if a 4-port device is separated into two 2-port sub-devices, then only a 2 port calibration is necessary. Thus, if the VNA being used to perform the present invention included 4 ports, a calibration may be performed using ports 1 and 2, but not 3 and 4. However, this would require that only 2 ports of the device be connected to the VNA at a time. Alternatively, a full 4 port calibration can be performed (as the parent calibration) and the entire 4-port device is connected to the VNA at one time. Further, if for example four separate 1-port devices are to be connected to a 4-port VNA at one time (e.g., as in FIG. 2), the parent calibration should be a full 4-port calibration. However, as explained below, preferably only those error coefficients relevant to the S-parameters of interest are used to correct S-parameter measurements.

At a step 706, one or more menus are presented to user to allow the user, or a test controller, to select which S-parameters are of interest. Exemplary menus are shown in FIGS. 4 and 5A–5C. Inputs, specifying which S-parameters are of interested, are accepted at a step 708.

At a step 710, the S-parameters of interest for each sub-device (or separate device) are determined, without determining S-parameters that are not of interest. This can be accomplished by measuring the S-parameters for each sub-device (or separate device), and then removing the appropriate calibration errors (determined during the calibration in step 704) from the measures S-parameters. In accordance with an embodiment of the present invention, only those error coefficients corresponding to the measured S-parameters are used. Such error coefficients are preferably maintained in fast working memory, so that there is no need to perform time consuming recalls from slower storage memory.

A new, somewhat more versatile VNA calibration utility has been presented that can save time by performing only those measurements that are required without having to recall different calibration setups. The prime benefits are for test systems trying to test multiple DUTs at a time and for multiport devices where not every path in the device is of interest. Both of these situations are of increasing importance in the more integrated and hybridized RF arena.

Many features of the present invention can be performed in, using, or with the assistance of hardware, software, firmware, or combinations thereof. Consequently, features of the present invention may be implemented using a processing system (e.g., including one or more processors). Such a processing system can be part of a VNA.

Features of the present invention can be implemented in, using, or with the assistance of a computer program product which is a storage medium (media) having instructions stored thereon/in which can be used to program a processing system to perform any of the features presented herein. The storage medium can include, but is not limited to ROMs, RAMs, EPROMs, EEPROMs, DRAMs, VRAMs, flash memory devices, or any type of media or device suitable for storing instructions and/or data.

Stored on any one of the machine readable medium (media), features of the present invention can be incorporated in software and/or firmware for controlling the hardware of a processing system, and for enabling a processing system to interact with other mechanism utilizing the results of the present invention. Such software or firmware may include, but is not limited to, application code, device drivers, operating systems and execution environments/containers.

Features of the invention may also be implemented in hardware using, for example, hardware components such as application specific integrated circuits (ASICs). Implementation of the hardware state machine so as to perform the functions described herein will be apparent to persons skilled in the relevant art(s).

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The breadth and scope of the present invention should not be limited by any of the above-described exemplary embodiments.

What is claimed is:

1. A method for efficiently characterizing an N-port device under test (DUT) using a vector network analyzer (VNA), wherein N is 2 or greater, the method including:
    (a) dividing the N-port DUT into multiple sub-devices, that each include less than N ports, based on transmission path levels between the N-ports;
    (b) performing at least an M-port VNA calibration, where M is equal to a number of ports on the one of the multiple sub-devices having the greatest number of ports; and
    (c) using the VNA to determine S-parameters for each sub-device; wherein step (a) includes
        (a.1) determining a transmission path level between each pair of the N ports; and
        (a.2) grouping ports together as being part of a same sub-device or a different sub-device based on relative transmission levels between the pairs of ports.

2. The method of claim 1, wherein step (a.2) includes for each port:
    comparing a highest transmission path level associated with the port to each other possible transmission path level associated with the port;
    grouping those of the other ports corresponding to a transmission level path within a threshold range of the highest transmission path, as being part of a same sub-device; and
    grouping those of the other ports corresponding to a transmission level path not within the threshold range of the highest transmission path, as being part of a separate sub-device.

3. The method of claim 2, wherein the threshold range is a predetermined number of dB.

4. The method of claim 1, wherein step (b) includes performing an M port calibration.

5. The method of claim 4, wherein more than one of the sub-devices can include M ports.

6. The method of claim 1, wherein step (b) includes performing an N port calibration.

7. The method of claim 1, wherein step (c) includes for each sub-device:
    (c.1) measuring S-parameters for the sub-device; and
    (c.2) removing calibration errors from the measured S-parameters, the calibration errors determined by the VNA during step (b).

8. A method for efficiently characterizing an N-port device under test (DUT) using a vector network analyzer (VNA), wherein N is 2 or greater, the method including:
    (a) dividing the N-port DUT into multiple sub-devices that each include less than N ports;
    (b) performing at least an M-port VNA calibration, where M is equal to a number of ports on the one of the multiple sub-devices having the greatest number of ports; and
    (c) using the VNA to determine S-parameters for each sub-device;
    wherein step (b) includes determining a set of error coefficients representative of calibration errors; and
    wherein step (c) includes for each sub-device
        (c.1) measuring S-parameters for the sub-device; and
        (c.2) removing calibration errors from the measured S-parameters using only a sub-set of the set of error coefficients determined in step (b), the sub-set corresponding to the measured S-parameters.

9. The method of claim 6, wherein step (a) can be performed by a user with or without the assistance of the VNA, or by the VNA with or without the assistance of a user.

10. A method to be performed with a vector network analyzer (VNA), the method for efficiently characterizing an N-port device under test (DUT), wherein N is 2 or greater, and wherein the N-port DUT is capable of being treated as multiple sub-devices that each include less than N ports, the method including:
    (a) performing at least an M-port VNA calibration, where M is equal to a number of ports on the one of the multiple sub-devices having the greatest number of ports;
    (b) presenting at least one menu that allows selection of which S-parameters are of interest for each sub-device;
    (c) accepting inputs from a user or a test controller that specify which S-parameters are of interest for each sub-device; and
    (d) determining the S-parameters of interest for each sub-device as identified at step (c), without determining the S-parameters that are not of interest;
    wherein step (b) comprises presenting a menu that includes links to the following sub-menus
    a sub-menu that allows selection of which ports of the VNA should be used to perform full S-parameter measurements;
    a sub-menu that allows selection of which ports of the VNA should be used to perform reflection only S-parameter measurements; and
    a sub-menu that allows selection of any possible combination of the S-parameters corresponding to a sub-device.

11. The method of claim 10, wherein step (d) includes for each sub-device:
(d.1) measuring the S-parameters of interest for each sub-device; and
(d.2) removing calibration errors from the measured S-parameters, the calibration errors determined by the VNA during step (a).

12. A method to be performed with a vector network analyzer (VNA), the method for efficiently characterizing an N-port device under test (DUT), wherein N is 2 or greater, and wherein the N-port DUT is capable of being treated as multiple sub-devices that each include less than N ports, the method including:
(a) performing at least an M-port VNA calibration, where M is equal to a number of ports on the one of the multiple sub-devices having the greatest number of ports;
(b) presenting at least one menu that allows selection of which S-parameters are of interest for each sub-device;
(c) accepting inputs from a user or a test controller that specify which S-parameters are of interest for each sub-device; and
(d) determining the S-parameters of interest for each sub-device as identified at step (c), without determining the S-parameters that are not of interest;
wherein step (a) includes determining a set of error coefficients representative of calibration errors; and
wherein step (d) includes
(d.1) measuring the S-parameters of interest for each sub-device; and
(d.2) removing calibration errors from the measured S-parameters using only a sub-set of the set of error coefficients determined in step (a), the sub-set corresponding to the measured S-parameters of interest as accepted in step (c).

13. The method of claim 12, wherein step (d.2) further includes determining the error coefficient sub-set using the following rules:
(i) for each reflection parameter specified at step (c), including corresponding reflectometer error coefficients in the error coefficient sub-set;
(ii) for each transmission parameter specified at step (c), including its corresponding transmission tracking error coefficient in the error coefficient sub-set; and
(iii) for each transmission parameter specified at step (c) that also has its matching reflection parameters specified at step (c), including its corresponding load match error coefficients in the error coefficient sub-set.

14. The method of claim 13, wherein the reflectometer error coefficients include directivity, source match and reflection tracking error coefficients.

15. The method of claim 12, wherein prior to step (d.2) the corresponding sub-set of error coefficients for each sub-device is made available in working memory so that error coefficients do not need to be recalled from storage memory each time step (d.2) is performed for a different one of the multiple sub-devices.

16. A method for efficiently characterizing multiple devices using an N-port vector network analyzer (VNA), wherein N is 2 or greater, and each device includes less than N ports, the method comprising:
(a) performing a parent calibration and storing a corresponding set of error coefficients in working memory;
(b) presenting at least one menu that allows a user or test controller to select which S-parameters are of interest for each device;
(c) accepting inputs that specify which S-parameters are of interest for each device; and
(d) determining the S-parameters of interest for each device as identified at step (c), without determining the S-parameters that are not of interest, as follows:
(d.1) measuring the S-parameters of interest for each device; and
(d.2) using only a sub-set of the set of error coefficients stored in working memory in step (a) to remove calibration errors from the measured S-parameters, without recalling error coefficients from static storage memory, the sub-set corresponding to the measured S-parameters of interest as specified in step (c).

17. The method of claim 16, wherein each device is a sub-device of a larger device capable of being treated as multiple sub-devices because of no or very low transmission between certain ports of the larger device.

18. The method of claim 16, wherein each device is a physically separate device.

19. The method of claim 16, wherein each device is either a sub-device of a larger device capable of being treated as multiple sub-devices because of no or very low transmission between certain ports of the larger device, or a physically separate device.

20. The method of claim 16, wherein step (d.2) further includes determining the error coefficient sub-set using the following rules:
(i) for each reflection parameter specified at step (c), including corresponding reflectometer error coefficients in the error coefficient sub-set;
(ii) for each transmission parameter specified at step (c), including its corresponding transmission tracking error coefficient in the error coefficient sub-set; and
(iii) for each transmission parameter specified at step (c) that also has its matching reflection parameters specified at step (c), including its corresponding load match error coefficients in the error coefficient sub-set.

* * * * *